US008904247B2

(12) United States Patent
Toyoda (10) Patent No.: US 8,904,247 B2
(45) Date of Patent: Dec. 2, 2014

(54) TEST PATTERN GENERATION APPARATUS, TEST PROGRAM GENERATION APPARATUS, GENERATION METHOD, PROGRAM, AND TEST APPARATUS

(71) Applicant: Advantest Corporation, Tokyo (JP)

(72) Inventor: Takuya Toyoda, Saitama (JP)

(73) Assignee: Advantest Corporation, Tokyo (JP)

( * ) Notice: Subject to any disclaimer, the term of this patent is extended or adjusted under 35 U.S.C. 154(b) by 166 days.

(21) Appl. No.: 13/655,468

(22) Filed: Oct. 19, 2012

(65) Prior Publication Data

US 2013/0290796 A1  Oct. 31, 2013

(30) Foreign Application Priority Data

Nov. 28, 2011  (JP) .................................. 2011-258916

(51) Int. Cl.
*G01R 31/28* (2006.01)
*H04L 12/26* (2006.01)
*G01R 29/26* (2006.01)

(52) U.S. Cl.
CPC ................ *H04L 43/50* (2013.01); *G01R 29/26* (2013.01)
USPC ............................. 714/715; 714/724; 714/741

(58) Field of Classification Search
USPC .......................................... 714/715, 724, 741
See application file for complete search history.

(56) References Cited

U.S. PATENT DOCUMENTS 4,225,957 A * 9/1980 Doty et al. ..................... 714/725
5,546,408 A * 8/1996 Keller ........................... 714/741

FOREIGN PATENT DOCUMENTS

| JP | 3-294968 A | 12/1991 |
| JP | 9-251800 A | 9/1997 |
| JP | H11-118889 A | 4/1999 |
| JP | 2002-131373 A | 5/2002 |
| JP | 2006-323706 A | 11/2006 |

OTHER PUBLICATIONS

Office Action for Japanese Patent Application No. 2011-258916, issued by the Japanese Patent Office on Sep. 17, 2013.

* cited by examiner

*Primary Examiner* — Sam Rizk (57) ABSTRACT

A test pattern generating apparatus that generates a test pattern to be communicated with a device under test having a plurality of terminals, the test pattern generating apparatus comprising a primitive generating section that generates a cycle primitive indicating a signal pattern to be communicated with each of the terminals during a base cycle, based on instructions from a user; a device cycle generating section that generates a device cycle indicating signal patterns of a plurality of base cycles, by arranging a plurality of the cycle primitives based on instructions from the user; and a sequence generating section that generates a sequence of the test pattern to be supplied to the device under test, by arranging a plurality of the device cycles based on instructions from the user.

16 Claims, 7 Drawing Sheets

TEST PATTERN GENERATION APPARATUS, TEST PROGRAM GENERATION APPARATUS, GENERATION METHOD, PROGRAM, AND TEST APPARATUS

BACKGROUND

1. Technical Field

The present invention relates to a test pattern generating apparatus, a test program generating apparatus, a generation method, a program, and a test apparatus.

2. Related Art

Conventionally, when testing a device under test with a test apparatus, the user creates a test program corresponding to the test using a programming language for the test apparatus, and this test program is used for testing after being debugged (for example, see Patent Documents 1 and 2).

Patent Document 1: Japanese Patent Application Publication No. 2006-323706
Patent Document 2: Japanese Patent Application Publication No. H11-118889

However, in order to create a test pattern, particularly one for communicating with a device under test, for this test program, the user must have programming experience and knowledge of programming languages for the test apparatus and hardware specifications of the test apparatus, and therefore it is difficult to create the test pattern easily.

SUMMARY

Therefore, it is an object of an aspect of the innovations herein to provide a test pattern generating apparatus, a test program generating apparatus, a generation method, a program, and a test apparatus, which are capable of overcoming the above drawbacks accompanying the related art. The above and other objects can be achieved by combinations described in the claims. A first aspect of the innovations may include a test pattern generating apparatus that generates a test pattern to be communicated with a device under test having a plurality of terminals, the test pattern generating apparatus comprising a primitive generating section that generates a cycle primitive indicating a signal pattern to be communicated with each of the terminals during a base cycle, based on instructions from a user; a device cycle generating section that generates a device cycle indicating signal patterns of a plurality of base cycles, by arranging a plurality of the cycle primitives based on instructions from the user; and a sequence generating section that generates a sequence of the test pattern to be supplied to the device under test, by arranging a plurality of the device cycles based on instructions from the user.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
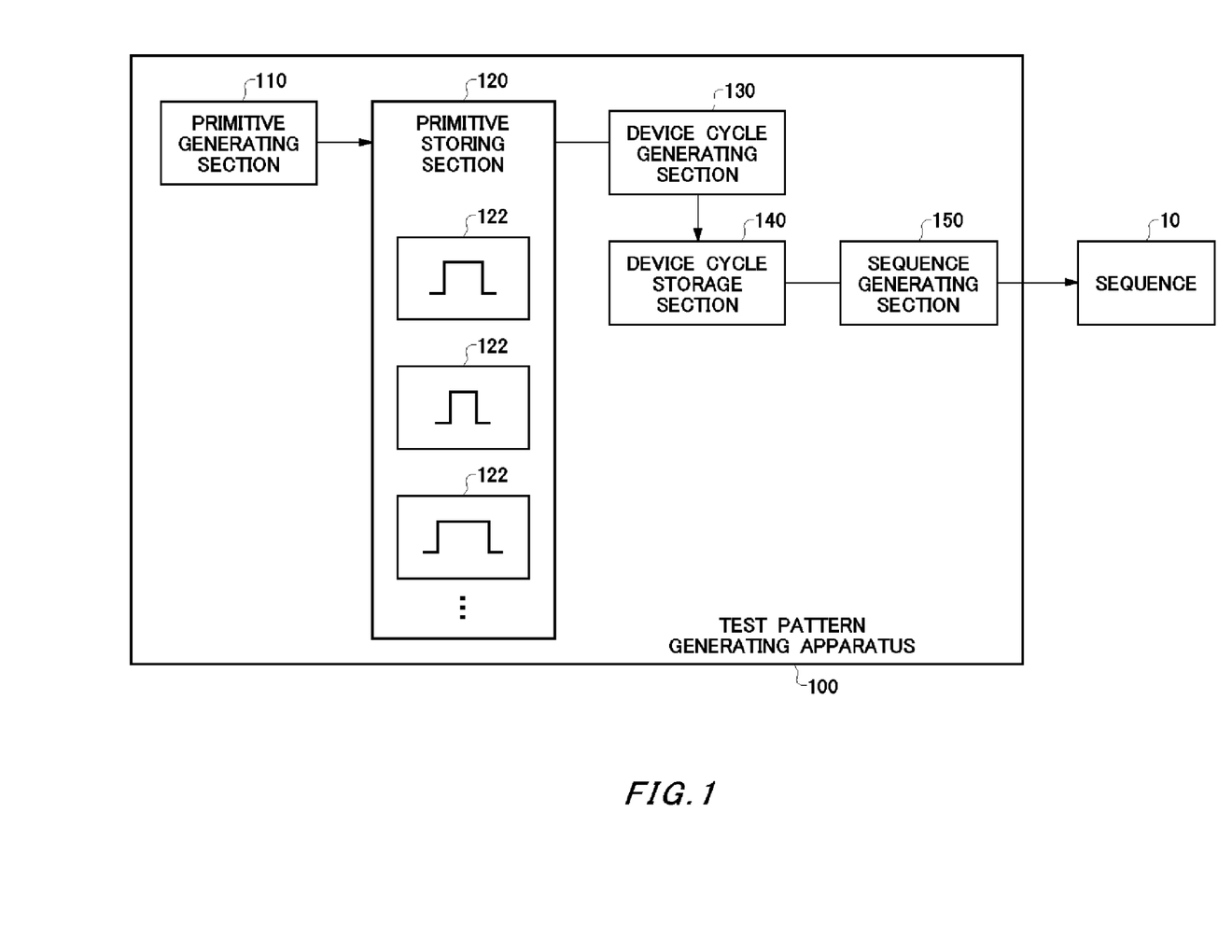
FIG. 1 shows an exemplary configuration of a test pattern generating apparatus 100 according to an embodiment of the present invention, along with a sequence 10.

FIG. 1 shows an exemplary configuration of a test pattern generating apparatus 100 according to an embodiment of the present invention, along with a sequence 10. The test pattern generating apparatus 100 generates a test pattern for communicating with a device under test that has a plurality of terminals. The test pattern generating apparatus 100 includes a primitive generating section 110, a primitive storing section 120, a device cycle generating section 130, a device cycle storing section 140, and a sequence generating section 150.

The primitive generating section 110 generates a cycle primitive 122 indicating a signal pattern for communication with each of the terminals during a base cycle, based on instructions from a user. Here, the base cycle is one cycle of the signal being transmitted between the test apparatus and the device under test, and may be the minimum signal unit that can be generated by the test apparatus. The cycle primitive 122 is a component element of the signal pattern in the base cycle.

The primitive generating section 110 generates the cycle primitive 122 as a waveform diagram. The primitive generating section 110 may generate the cycle primitive 122 in response to the user inputting a parameter for shaping the signal waveform. The primitive generating section 110 generates a cycle primitive 122 for each terminal of the device under test. The primitive generating section 110 may store a signal waveform template in advance, and generate the cycle primitive 122 in response to a user calling up the template and inputting or changing a parameter.

The primitive storing section 120 stores the cycle primitive 122 generated by the primitive generating section 110. The primitive storing section 120 may store parameters or the like input by the user as a data file. The primitive storing section 120 may be a memory device that stores data, or may be an external storage device. The primitive storing section 120 may store a template for the cycle primitive 122, and the primitive generating section 110 may retrieve the template and display the template to the user.

The device cycle generating section 130 arranges a plurality of the cycle primitives 122 based on instructions from the user, to generate a device cycle indicating a signal pattern of a plurality of base cycles. Here, the device cycle may be generated in signal units that have a meaning of commands or responses, for example, to the device under test. The device cycle generating section 130 generates the device cycle with a waveform diagram.

The device cycle storing section 140 stores the device cycle generated by the device cycle generating section 130. The device cycle storing section 140 may be a memory apparatus that stores data or may be an external storage apparatus, for example.

The sequence generating section 150 arranges a plurality of the device cycles based on instructions from the user, to generate a sequence 10 of the test pattern to be supplied to the device under test. The sequence generating section 150 generates the test pattern sequence 10 in a table format. Specifically, according to instructions from the user, the sequence generating section 150 arranges the device cycles in a table format and outputs, as the test pattern, the sequence 10 having this device cycle arrangement recorded therein.

Figure 2:
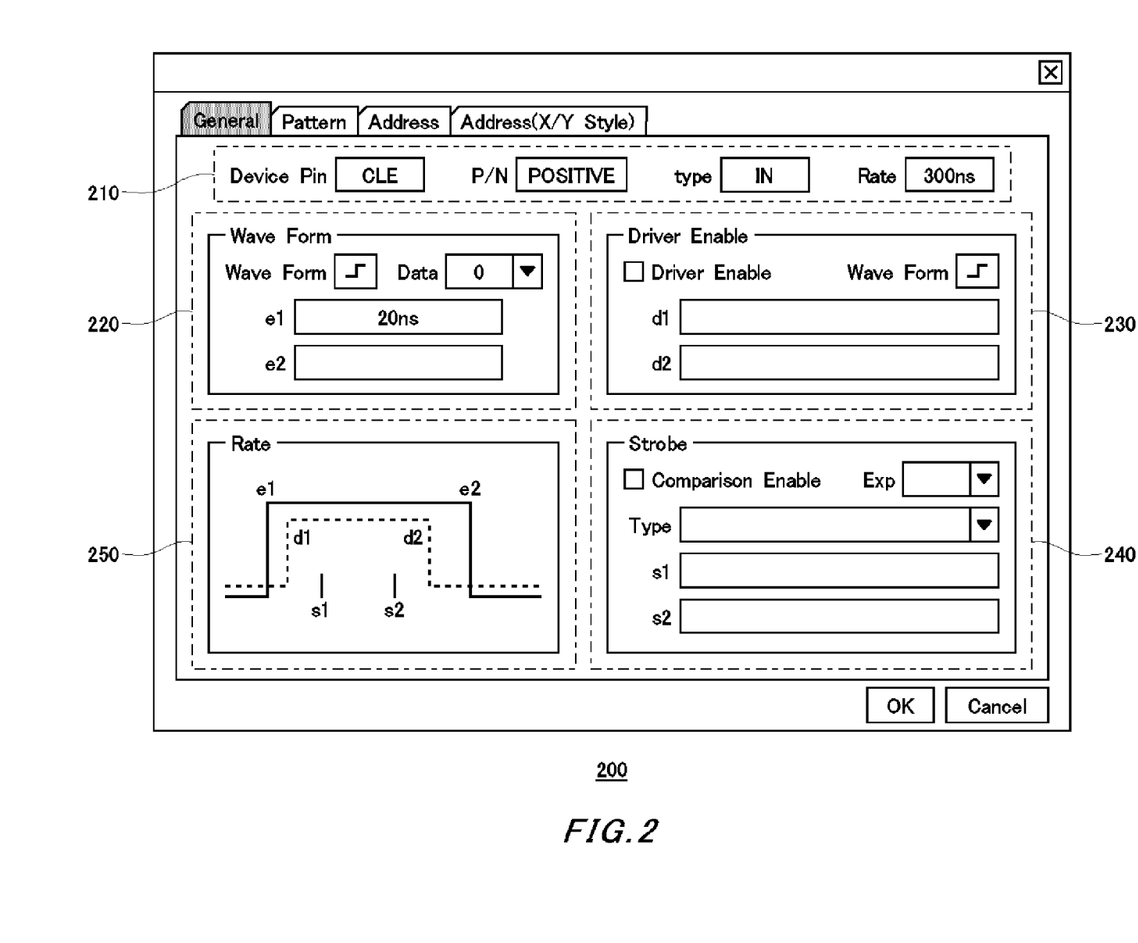
FIG. 2 shows an exemplary configuration of a setting screen 200 displayed to the user by the primitive generating section 110 according to the present embodiment.

FIG. 2 shows an exemplary configuration of a setting screen 200 displayed to the user by the primitive generating section 110 according to the present embodiment. The setting screen 200 includes a terminal information display section 210, a waveform information display section 220, a driver operation range display section 230, a strobe information display section 240, and a waveform describing section 250.

The terminal information display section 210 shows terminal information of the device under test to be communicated with. The terminal information display section 210 shows terminal information such as the name of the terminal, positive/negative logic, terminal type, and cycle time, for example. The terminal information display section 210 may display results input by the user in a terminal information input section where the terminal information is input. In this case, the terminal information input section may display a screen into which the terminal information is input and the user may input this terminal information. The terminal information display section 210 may allow the user to input and change the terminal information by having the user manipulate the displayed region.

For example, the terminal information display section 210 displays the terminal name in a region indicated by "Device Pin." Furthermore, in the region where the terminal positive/negative logic is indicated by "P/N," the terminal information display section 210 displays "POSITIVE" when the logic is positive and displays "NEGATIVE" when the logic is negative.

In the region where the terminal type is indicated by "type," the terminal information display section 210 displays "IO" when the terminal is an input/output terminal, "IN" when the terminal is a driver terminal, "INH" when the terminal is a high-voltage driver terminal, and "OUT" when the terminal is a comparator terminal. Here, an input terminal is a terminal that receives and outputs the pattern signal, a driver terminal is a terminal that receives the pattern signal, and a comparator terminal is a terminal that outputs a response signal.

The terminal information display section 210 may display the time of one cycle of the cycle primitive 122 in the region indicated by "Rate." FIG. 2 shows an example in which the user generates a cycle primitive 122 in which one cycle is 300 ns, the terminal is a driver terminal, and the logic is positive, for a "CLE" terminal of the device under test.

The waveform information display section 220 displays waveform information of the generated cycle primitive 122, according to input from the user. The waveform information display section 220 displays information such as the timing value, data, and waveform mode of the cycle primitive 122. The waveform information display section 220 may allow the waveform information to be input or changed by the user manipulating the displayed region.

For example, the waveform information display section 220 displays the waveform mode in a region indicated by "Wave Form." The waveform information display section 220 may allow the user to select an NRZ waveform, an inverse NRZ waveform, an RZ waveform, an inverse RZ waveform, a high signal, a low signal, or an open signal as the waveform mode, by displaying characters or icons, for example. FIG. 2 shows an example in which the waveform information display section 220 displays an icon indicating an NRZ waveform, according to the user inputting an NRZ waveform selection.

The waveform information display section 220 displays "1" or "0" in the region where the waveform data value is indicated by "Data." The waveform information display section 220 displays a first timing of the waveform in a region indicated by "e1." The waveform information display section 220 displays a second timing of the waveform in a region indicated by "e2." The user may input the first timing value and the second timing value into the waveform information display section 220 respectively as the rising timing value and the falling timing value.

The driver operation range display section 230 displays waveform information for a range of the generated pattern signal in which the pattern signal operates as a driver signal input to the device under test, according to the input of the user. The driver operation range display section 230 displays waveform information such as the timing value and waveform mode of the cycle primitive 122. The driver operation range display section 230 may allow the waveform information to be input and changed by a user manipulating the displayed region.

The driver operation range display section 230 enables user input when the "type" region of the terminal information display section 210 displays "IO" and communication is performed with the input/output terminal of the device under test. The test pattern generating apparatus 100 generates the waveform input by the user as the driver signal, in response to a user entering a check in a checkbox of the region indicating "Driver Enable" of the driver operation range display section 230, for example.

The driver operation range display section 230 displays the waveform mode in the region indicated by "Wave Form." The driver operation range display section 230 may allow the user to select an NRZ waveform or an RZ waveform, for example, as the waveform mode, by displaying characters or icons.

The driver operation range display section 230 displays a third timing value of the waveform in a region indicated by "d1." The driver operation range display section 230 displays a fourth timing value of the waveform in a region indicated by "d2." The user may input the third timing value and the fourth timing value into the driver operation range display section 230 respectively as the driver waveform start timing value and the driver waveform end timing value.

The strobe information display section 240 displays strobe information when making a comparison judgment between the timing of an output signal from the device under test and the timing of a strobe signal, according to input from the user. The strobe information display section 240 displays strobe information such as an expected value, strobe signal type, and strobe position. The strobe information display section 240 may allow the strobe information to be input or changed by the user manipulating the displayed region.

The strobe information display section 240 activates the user input when the "type" region of the terminal information display section 210 displays "IO" or "OUT" and communication is performed with the output terminal of the device under test. The test pattern generating apparatus 100 generates a pattern signal making a comparison judgment with an expected value at the strobe timing input by the user, in response to a user entering a check in a checkbox of the region indicating "Comparison Enable" of the strobe information display section 240, for example.

The strobe information display section 240 displays the expected value in the region indicated by "Exp." The strobe information display section 240 may allow the user to select "1," "0," "high," or "low," for example, as the expected value, by displaying characters or icons. The strobe information display section 240 displays the strobe signal type in the region indicated by "Type." The strobe information display section 240 may display and allow the user to select "single" as the strobe signal type for making a comparison judgment at a single strobe signal position and "Window" as the strobe signal type for making a comparison judgment in a range between two strobe signal positions.

The strobe information display section 240 displays a fifth timing value of the waveform in a region indicated by "s1." The strobe information display section 240 displays a sixth timing value of the waveform in a region indicated by "s2." The user may input the fifth timing value into the strobe information display section 240 as the strobe position for a "Single" strobe or as the comparison judgment start position for a "Window" strobe, and may input the sixth timing value as the comparison judgment end position for a "Window" strobe.

The waveform describing section 250 displays a positional relationship over time between the waveform and the parameter forming the waveform. The waveform describing section 250 displays a general positional relationship over time, thereby enabling the user to understand the relationship between the waveform and the set parameter. FIG. 2 shows an example in which the waveform describing section 250 shows the first to sixth timing values together with a schematic diagram of waveforms using solid and dashed lines.

As described above, the primitive generating section 110 according to the present embodiment displays the waveform information for one cycle of the signal transmitted to and received from the device under test, and generates the cycle primitive 122 according to the input from the user. The primitive generating section 110 enables user input by using a graphical user interface such as a radio button, a check box, a slider, a spin button, a list box, a drop-down list, or a text box. Therefore, the user can generate the cycle primitive 122 without knowing the hardware specifications of the test apparatus or a programming language for the test apparatus, for example.

Figure 3:
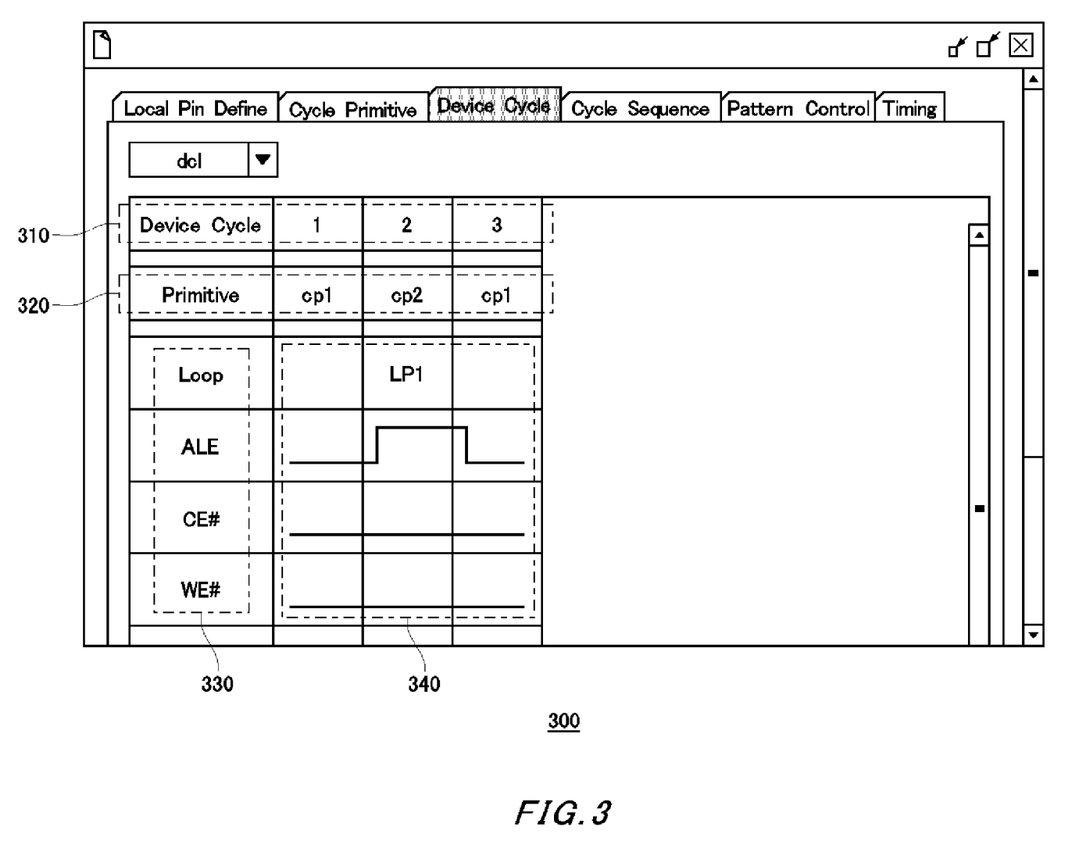
FIG. 3 shows an exemplary configuration of a setting screen 300 that is displayed to the user by the device cycle generating section 130 according to the present embodiment.

FIG. 3 shows an exemplary configuration of a setting screen 300 that is displayed to the user by the device cycle generating section 130 according to the present embodiment. The setting screen 300 includes a number display section 310, a name display section 320, a terminal name display section 330, and a waveform display region 340.

The number display section 310 displays a number for the arranged cycle primitive 122. The number display section 310 may display the signal waveform of the cycle primitive 122 with a number attached thereto indicating the order in which the cycle primitive 122 is communicated as a device cycle.

The name display section 320 displays the name of the arranged cycle primitive 122. The name of the cycle primitive 122 may be a file name attached to the cycle primitive 122, or may be a label attached to the cycle primitive 122.

The terminal name display section 330 displays the terminal name of the device under test. FIG. 3 shows an example in which the terminal name display section 330 displays four terminal names of the device under test, which are "LOOP," "ALE," "CE#," and "WE#."

The waveform display region 340 shows a waveform diagram of the arranged cycle primitive 122. FIG. 3 shows an example in which a waveform diagram of three cycle primitives 122 "cp1," "cp2," and "cp3" is displayed, in response to the user arranging these three cycle primitives 122 in the stated order as the device cycle.

Upon receiving instructions from the user during generation of the device cycle as the waveform diagram, the device cycle generating section 130 brings up a timing editor for editing the timing in a table format, and allows the timing values of the signal pattern to be set. In other words, in response to instructions from the user, the device cycle generating section 130 brings up the timing editor that displays numerical values of the device cycle timings in a table format and allows the user to edit these numerical values of the timings. As a result, the device cycle generating section 130 can enable direct editing of the specific timing values, while checking the waveform of the device cycle using the waveform diagram.

The device cycle generating section 130 generates the device cycle to include a loop process. In response to a designation by the user, the device cycle generating section 130 may include a loop process that contains a designated number of one or more cycle primitives 122. Here, the device cycle generating section 130 may allow the user to designate the loop process range using the numbers in the number display section 310.

The device cycle generating section 130 may include, in the device cycle, a loop process that loops the designated number of times while performing a comparison judgment. In this case, as a result of the comparison judgment, the device cycle generating section 130 may allow the user to designate a process for a case where there is a match with the expected value and a process for a case where there is not a match with the expected value.

When the device cycle includes a loop process, the device cycle generating section 130 may display the name of the loop variable in a timing table or the waveform diagram of the waveform display region 340, in response to the user designating the loop variable. In this case, the device cycle generating section 130 may display the name of the loop variable in the setting screen 300. FIG. 3 shows an example in which the waveform display region 340 displays the loop variable "LP1." Here, the device cycle generating section 130 may display detailed information concerning the loop process in response to the user clicking the loop variable "LP1."

In this way, the device cycle generating section 130 enables the user to generate the device cycle while displaying the waveform diagram of the cycle primitives 122. Accordingly, the user can generate the device cycle without having knowledge of the hardware specifications of the test apparatus or a programming language for the test apparatus, for example.

Figure 4:
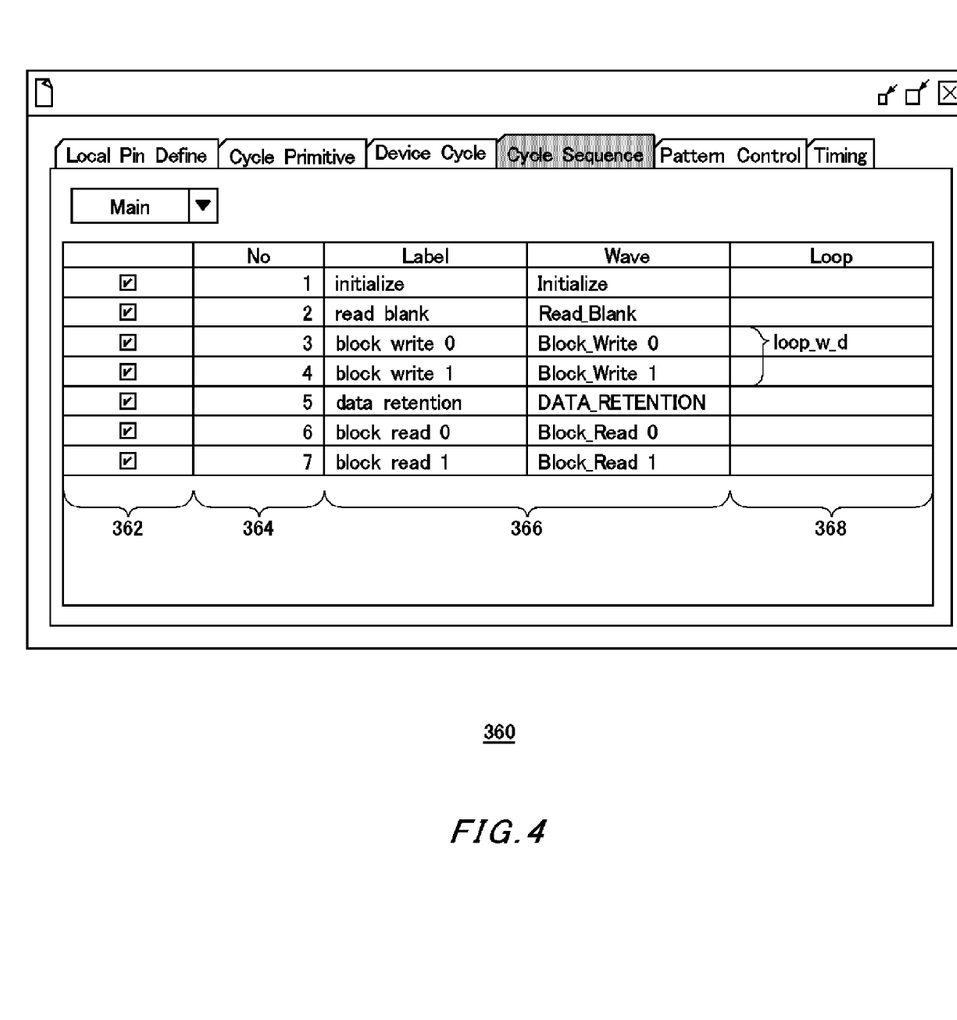
FIG. 4 shows an exemplary configuration of a setting screen 360 displayed to the user by the sequence generating section 150.

FIG. 4 shows an exemplary configuration of a setting screen 360 displayed to the user by the sequence generating section 150. The setting screen 360 shows the device cycles included in the sequence 10, in a table format. The setting screen 360 includes an execution designating column 362, a number display column 364, and a name display column 366.

The execution designating column 362 designates whether the device cycle displayed on the same line is to be executed. The execution designating column 362 includes check boxes, and the device cycle in a row where a check is input may be set as a device cycle to be executed, in response to the user entering a check in the check box.

The number display column 364 is a column that indicates the row number. The number display column 364 may sequentially assign numbers from 1, beginning with the first row of the table. The sequence generating section 150 may set this number as the number for the order in which the signal waveforms of the device cycle are to be communicated as a pattern signal.

The name display column 366 displays the name of the device cycle. Here, the name of the device cycle may be a file name attached to the device cycle, or may be a label attached to the device cycle.

The sequence generating section 150 generates the sequence of the test pattern to include a loop process. In response to a designation by the user, the sequence generating section 150 may include a loop process that contains a designated number of one or more device cycles. Here, the sequence generating section 150 may allow the user to designate the loop process range using the numbers in the number display column 364.

The sequence generating section 150 may include, in the sequence, a loop process that loops the designated number of times while performing a comparison judgment. In this case, as a result of the comparison judgment, the sequence generating section 150 may allow the user to designate a process for a case where there is a match with the expected value and a process for a case where there is not a match with the expected value.

When the test pattern sequence includes a loop process, the sequence generating section 150 may display the name of the loop variable of the sequence in a table format, in response to the user designating the loop variable. In this case, the sequence generating section 150 may display the name of the loop variable by providing a loop information display column 368 in the setting screen 360. FIG. 4 shows an example in which the loop information display column 368 displays "loop_w_d" as the loop variable. The sequence generating section 150 may display details concerning the loop process in response to the user clicking on the loop variable "loop_w_d."

In this way, the sequence generating section 150 enables the user to generate the sequence 10 while displaying the device cycles designated by the user in a table format in the setting screen 360. Accordingly, the user can generate the sequence 10, which is a test pattern, without having knowledge of the hardware specifications of the test apparatus or a programming language for the test apparatus, for example.

Figure 5:
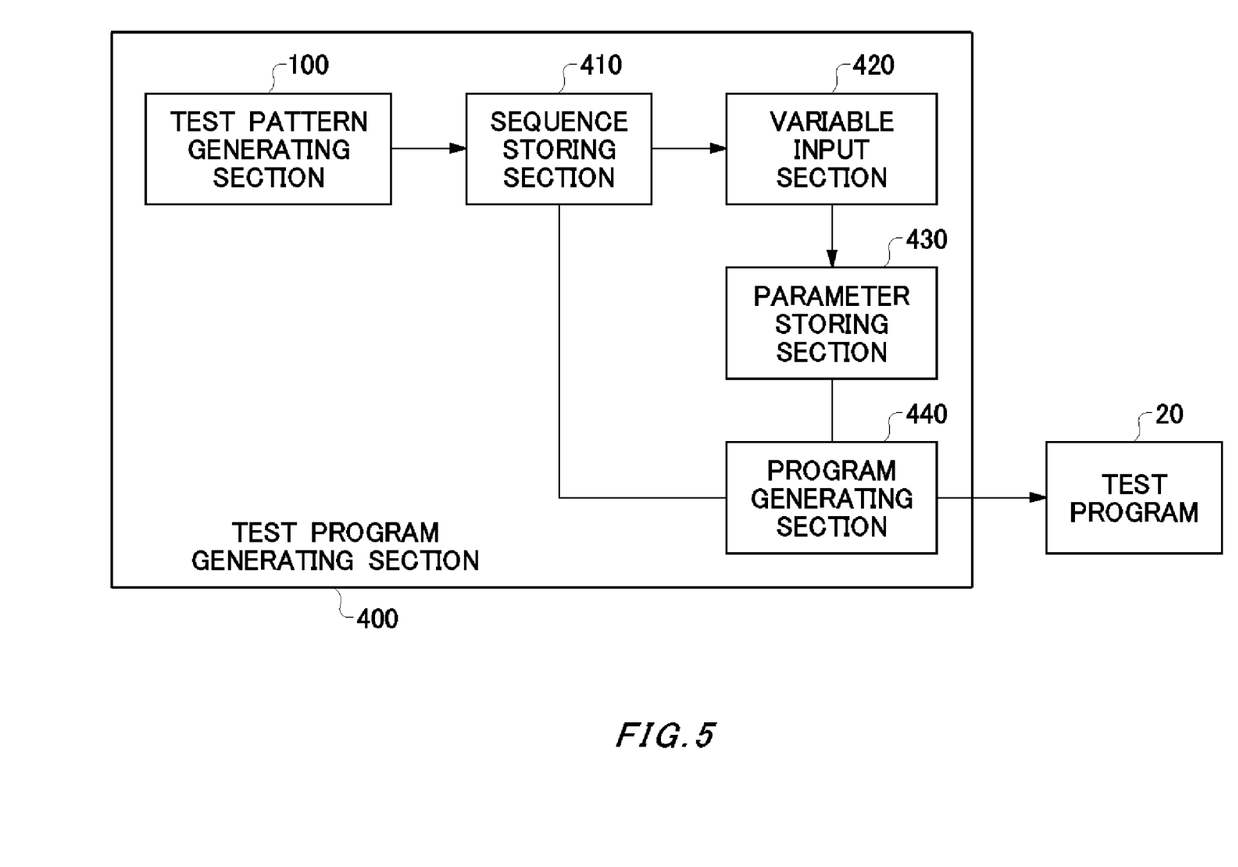
FIG. 5 shows an exemplary configuration of the test program generating apparatus 400 according to the present embodiment, along with a test program 20.

FIG. 5 shows an exemplary configuration of the test program generating apparatus 400 according to the present embodiment, along with a test program 20. The test program generating apparatus 400 generates a test program for a device under test including a plurality of terminals. The test program generating apparatus 400 includes the test pattern generating apparatus 100 described in FIGS. 1 to 4, a sequence storing section 410, a variable input section 420, a parameter storing section 430, and a program generating section 440.

The sequence storing section 410 saves the test pattern sequence 10 generated by the test pattern generating apparatus 100 as a test pattern file. The sequence storing section 410 may be a memory apparatus that stores data or an external storage device, for example.

The variable input section 420 inputs the variable value used for the test pattern sequence 10, based on instructions from the user. The variable input section 420 may input, as the variable, original data for the data value and address value for the device under test. The variable input section 420 may input, as this variable, a value that designates the number of loops in the loop process included in the device cycle or the sequence 10.

The variable input section 420 may bring up the loop process set by the user in the setting screen of the sequence generating section 150 or the device cycle generating section 130, in response to instructions. The variable input section 420 inputs the variable according to a designation by the user.

The parameter storing section 430 stores the variable input by the variable input section 420, as a parameter file. The parameter storing section 430 may be a memory apparatus that stores data or may be an external storage apparatus, for example.

The program generating section 440 generates the test program 20 by associating a test pattern file and a test parameter file with the test program, based on instructions from the user. The program generating section 440 may generate the test program 20 in an executable format.

The program generating section 440 generates in advance a test program having information including the test flow, test conditions, and algorithms for the hardware module, thereby associating a test pattern with this test program to generate the test program 20. As a result, the test program generating apparatus 400 can generate the test program 20 using a test pattern generated by a user who does not know the hardware specifications of the test apparatus or a programming language for the test apparatus.

Figure 6:
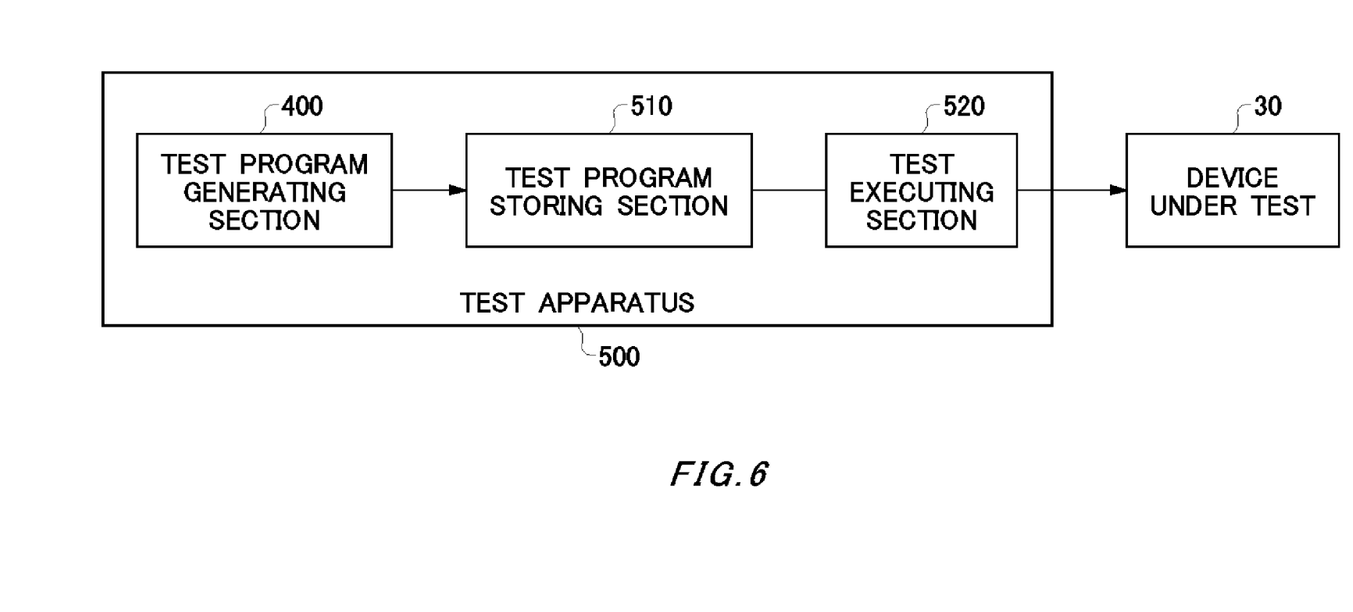
FIG. 6 shows an exemplary configuration of a test apparatus 500 according to the present embodiment, along with a device under test 30.

FIG. 6 shows an exemplary configuration of a test apparatus 500 according to the present embodiment, along with a device under test 30. The test apparatus 500 tests the device under test 30 including a plurality of terminals. The test apparatus 500 includes the test program generating apparatus 400 described in FIG. 5, a test program storing section 510, and a test executing section 520.

The test program storing section 510 stores the test program 20 generated by the test program generating apparatus 400. The test program storing section 510 may be a memory apparatus that stores data or may be an external storage apparatus, for example.

The test executing section 520 tests the device under test 30 with the test program 20 using the value for the variable designated in the test parameter file and the test pattern designated in the test pattern file associated with the test program 20. The test executing section 520 may test at least one device under test 30, which may be an analog circuit, a digital circuit, an analog/digital mixed circuit, a memory, or a system on chip (SOC), for example. The device under test 30 may be a memory device.

The test executing section 520 inputs to the device under test 30 a test signal based on a test program 20 for testing the device under test 30, and judges pass/fail of the device under test 30 based on an output signal output by the device under test 30 in response to the test signal. In this way, the test executing section 520 can perform testing based on a test program 20 that uses the sequence 10 generated by the user using the test pattern generating apparatus 100.

In the above embodiment, the test executing section 520 is provided in the test apparatus 500 along with the test program generating apparatus 400. Instead, the test executing section 520 may be a test apparatus provided outside of the test program generating apparatus 400. In this case, the test program storing section 510 and the test program generating apparatus 400 in FIG. 5 may be a separate test program generating apparatus, and this test program generating apparatus may be electrically connected to the test apparatus. The test program generating apparatus and the test apparatus may be connected by a network using wired and/or wireless communication.

In this way, the test program generating apparatus can be formed by a computing device such as a personal computer or a work station, and can generate the test program at a location other than the test apparatus. Furthermore, the test program can be generated within a computing device, and therefore the test program can be efficiently generated by executing an application for debugging the test program within the computing device. The computing device can execute an evaluation and analysis application for the test results, thereby enabling the user to evaluate and analyze the test results during execution of the testing by the test apparatus.

Figure 7:
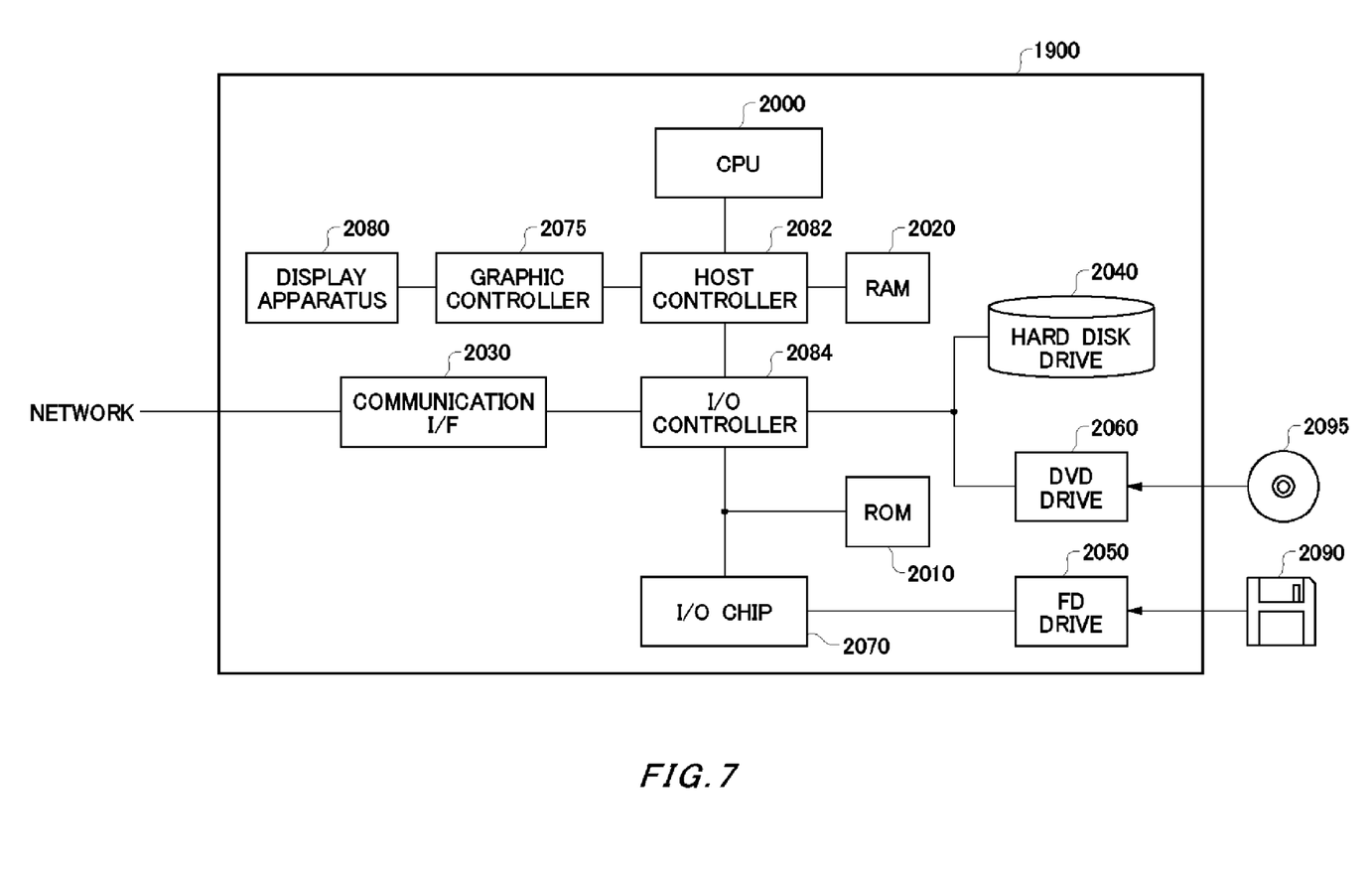
FIG. 7 shows an example of a hardware configuration of a computer 1900 according to the present embodiment.

FIG. 7 shows an example of a hardware configuration of a computer 1900 according to the present embodiment. The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a hard disk drive 2040, and a DVD drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, and the hard disk drive 2040, and the DVD drive 2060 to the host controller 2082. The communication interface 2030 communicates with another apparatus via a network. The hard disk drive 2040 stores the programs and data used by the CPU 2000 housed in the computer 1900. The DVD drive 2060 reads the programs and data from a DVD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to the input/output controller 2084 along with each of the input/output apparatuses via, a parallel port, a serial port, a keyboard port, a mouse port, or the like.

The programs provided to the hard disk drive 2040 via the RAM 2020 are stored in a storage medium, such as the flexible disk 2090, the DVD-ROM 2095, or an IC card, and provided by a user. The programs are read from storage medium, installed in the hard disk drive 2040 inside the computer 1900 via the RAM 2020, and performed by the CPU 2000.

The programs are installed in the computer 1900 to make the computer 1900 function as the test pattern generating apparatus 100 or the test program generating apparatus 400.

The information processes recorded in these programs are read by the computer 1900 to cause the computer 1900 to function as software and hardware described above, which are exemplified by the specific sections of test pattern generating apparatus 100 and the test program generating apparatus 400. With these specific sections, a unique primitive generating section 110, primitive storing section 120, device cycle generating section 130, device cycle storing section 140, sequence generating section 150, sequence storing section 410, variable input section 420, parameter storing section 430, and program generating section 440, for example, can be configured by realizing the calculations or computations appropriate for the intended use of the computer 1900 of the present embodiment.

For example, if there is communication between the computer 1900 and an external apparatus or the like, the CPU 2000 performs the communication program loaded in the RAM 2020, and provides the communication interface 2030 with communication processing instructions based on the content of the process recorded in the communication program. The communication interface 2030 is controlled by the CPU 2000 to read the transmission data stored in the transmission buffer area or the like on the storage apparatus, such as the RAM 2020, the hard disc 2040, the flexible disk 2090, or the DVD-ROM 2095, and send this transmission data to the network, and to write data received from the network onto a reception buffer area on the storage apparatus. In this way, the communication interface 2030 may transmit data to and from the storage apparatus through DMA (Direct Memory Access). As another possibility, the CPU 2000 may transmit the data by reading the data from the storage apparatus or communication interface 2030 that are the origins of the transmitted data, and writing the data onto the communication interface 2030 or the storage apparatus that are the transmission destinations.

The CPU 2000 may perform various processes on the data in the RAM 2020 by reading into the RAM 2020, through DMA transmission or the like, all or a necessary portion of the database or files stored in the external apparatus such as the hard disk 2040, the DVD drive 2060, the DVD-ROM 2095, the flexible disk drive 2050, or the flexible disk 2090. The CPU 2000 writes the processed data back to the external apparatus through DMA transmission or the like. In this process, the RAM 2020 is considered to be a section that temporarily stores the content of the external storage apparatus, and therefore the RAM 2020, the external apparatus, and the like in the present embodiment are referred to as a memory, a storage section, and a storage apparatus. The variety of information in the present embodiment, such as the variety of programs, data, tables, databases, and the like are stored on the storage apparatus to become the target of the information processing. The CPU 2000 can hold a portion of the RAM 2020 in a cache memory and read from or write to the cache memory. With such a configuration as well, the cache memory serves part of the function of the RAM 2020, and therefore the cache memory is also included with the RAM 2020, the memory, and/or the storage apparatus in the present invention, except when a distinction is made.

The CPU 2000 executes the various processes such as the computation, information processing, condition judgment, searching for/replacing information, and the like included in the present embodiment for the data read from the RAM 2020, as designated by the command sequence of the program, and writes the result back onto the RAM 2020. For example, when performing condition judgment, the CPU 2000 judges whether a variable of any type shown in the present embodiment fulfills a condition of being greater than, less than, no greater than, no less than, or equal to another variable or constant. If the condition is fulfilled, or unfulfilled, depending on the circumstances, the CPU 2000 branches into a different command sequence or acquires a subroutine.

The CPU 2000 can search for information stored in a file in the storage apparatus, the database, and the like. For example, if a plurality of entries associated respectively with a first type of value and a second type of value are stored in the storage apparatus, the CPU 2000 can search for entries fulfilling a condition designated by the first type of value from among the plurality of entries stored in the storage apparatus. The CPU 2000 can then obtain the second type of value associated with the first type of value fulfilling the prescribed condition by reading the second type of value stored at the same entry.

The programs and modules shown above may also be stored in an external storage medium. The flexible disk 2090, the DVD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test pattern generating apparatus that generates a test pattern to be communicated with a device under test having a plurality of terminals, the test pattern generating apparatus comprising:

a primitive generating section that generates a cycle primitive indicating a signal pattern to be communicated with each of the terminals during a base cycle, based on instructions from a user, said instructions including a waveform mode, a waveform data value and rising and falling time values of the cycle primitive;

a device cycle generating section that generates a device cycle indicating signal patterns having a plurality of base cycles, by setting an order of a plurality of the cycle primitives based on instructions from the user; and a sequence generating section that generates a sequence of the test pattern to be supplied to the device under test, by setting an order of a plurality of the device cycles based on instructions from the user.

2. The test pattern generating apparatus according to claim 1, wherein the primitive generating section generates the cycle primitives as waveform diagrams, and the sequence generating section generates the test pattern sequence in a table format.

3. The test pattern generating apparatus according to claim 2, wherein the sequence generating section generates the test pattern sequence to include a loop process.

4. The test pattern generating apparatus according to claim 3, wherein when the test pattern sequence includes a loop process, the sequence generating section displays a name of a loop variable in the sequence in a table format, in response to the user designating the loop variable.

5. The test pattern generating apparatus according to claim 1, wherein the device cycle generating section generates the device cycle as a waveform diagram.

6. The test pattern generating apparatus according to claim 5, wherein upon receiving designation from the user during generation of the device cycle as a waveform diagram, the device cycle generating section brings up a timing editor for editing a timing chart in a table format and allows the user to set a timing value of the signal pattern.

7. The test pattern generating apparatus according to claim 6, wherein the device cycle generating section generates the device cycle to include a loop process.

8. The test pattern generating apparatus according to claim 7, wherein when the device cycle includes a loop process, the device cycle generating section displays a name of a loop variable in the timing chart or the waveform diagram, in response to the user designating the loop variable.

9. A test program generating apparatus that generates a test program for a device under test including a plurality of terminals, the test program generating apparatus comprising:

the test pattern generating apparatus according to claim 1;

a sequence storing section that stores, as a test pattern file, the test pattern sequence generated by the test pattern generating apparatus;

a variable input section that inputs a variable value used for the test pattern sequence, based on instructions from the user;

a parameter storing section that stores the input variable as a parameter file; and a program generating section that associates the test pattern file and the test parameter file with the test program based on instructions from the user, thereby generating the test program.

10. The test program generating apparatus according to claim 9, wherein the program generating section generates the test program in an executable format.

11. The test program generating apparatus according to claim 9, wherein the device under test is a memory device.

12. The test program generating apparatus according to claim 11, wherein the variable input section inputs, as the variable, original data of a data value and address value for the memory device.

13. The test program generating apparatus according to claim 9, wherein the variable input section inputs, as the variable, a value designating a number of loops for the loop process included in the device cycle or the sequence.

14. A test apparatus that tests a device under test having a plurality of terminals, the test apparatus comprising:

the test program generating apparatus according to claim 9;

a test program storing section that stores the test program generated by the test program generating apparatus; and a test executing section that tests the device under test with the test program using the variable value designated in the test parameter file and the test pattern designated in the test pattern file associated with the test program.

15. A method for generating a test program for executing a test of a device under test having a plurality of terminals, the method comprising:
- generating a cycle primitive indicating a signal pattern to be communicated with each of the terminals during a base cycle, based on instructions from a user, said instructions including a waveform mode, a waveform data value and rising and falling time values of the cycle primitive;
- generating a device cycle indicating signal patterns having a plurality of base cycles, by setting an order of a plurality of the cycle primitives based on instructions from the user;
- generating a sequence of the test pattern to be supplied to the device under test, by setting an order of a plurality of the device cycles based on instructions from the user;
- storing the test pattern sequence as a test pattern file;
- inputting a variable value used for the test pattern sequence, based on instructions from the user;
- storing the input variable as a parameter file; and
- associating the test pattern file and the parameter file based on instructions from the user, thereby generating the test program.

16. A non-transitory computer readable storage medium having instructions stored thereon that, when executed by a processor, causes the processor to perform operations comprising:
- generating a cycle primitive indicating a signal pattern to be communicated with each of the terminals during a base cycle, based on instructions from a user, said instructions including a waveform mode, a waveform data value and rising and falling time values of the cycle primitive;
- generating a device cycle indicating signal patterns having a plurality of base cycles, by setting an order of a plurality of the cycle primitives based on instructions from the user;
- generating a sequence of the test pattern to be supplied to the device under test, by setting an order of a plurality of the device cycles based on instructions from the user;
- storing the test pattern sequence as a test pattern file;
- inputting a variable value used for the test pattern sequence, based on instructions from the user;
- storing the input variable as a parameter file; and
- associating the test pattern file and the parameter file based on instructions from the user, thereby generating the test program.

* * * * *